United States Patent
Ho et al.

(10) Patent No.: US 6,902,997 B2
(45) Date of Patent: *Jun. 7, 2005

(54) PROCESS OF FORMING BONDING COLUMNS

(75) Inventors: Kwun-Yao Ho, Hsin-Tien (TW); Moriss Kung, Hsin-Tien (TW)

(73) Assignee: VIA Technologies, Inc., Taipei Hsien (TW)

(*) Notice: Subject to any disclaimer, the term of this patent is extended or adjusted under 35 U.S.C. 154(b) by 0 days.

This patent is subject to a terminal disclaimer.

(21) Appl. No.: 10/903,217

(22) Filed: Jul. 30, 2004

(65) Prior Publication Data

US 2005/0003651 A1 Jan. 6, 2005

Related U.S. Application Data

(63) Continuation of application No. 10/389,217, filed on Mar. 14, 2003, now Pat. No. 6,849,534.

(30) Foreign Application Priority Data

Oct. 25, 2002 (TW) .......................... 91125108 A

(51) Int. Cl.⁷ ............................................. H01L 21/44
(52) U.S. Cl. ........................ 438/614; 438/613; 438/612
(58) Field of Search ................................ 438/614, 615, 438/613, 612, 631, 633

(56) References Cited

U.S. PATENT DOCUMENTS

| | | | | |
|---|---|---|---|---|
| 5,514,260 A | * | 5/1996 | Seo ........................ | 204/298.26 |
| 6,042,953 A | * | 3/2000 | Yamaguchi et al. ......... | 428/652 |
| 6,060,378 A | * | 5/2000 | Rolfson ..................... | 438/612 |
| 6,103,386 A | * | 8/2000 | Raybould et al. ........... | 428/472 |
| 6,127,259 A | * | 10/2000 | Shields et al. .............. | 438/626 |
| 6,420,255 B1 | * | 7/2002 | Takahashi ................... | 438/613 |
| 6,479,376 B1 | * | 11/2002 | Huang et al. ............... | 438/613 |
| 6,593,220 B1 | * | 7/2003 | Yu et al. .................... | 438/612 |
| 6,599,775 B2 | * | 7/2003 | Tie et al. .................... | 438/108 |
| 6,649,507 B1 | * | 11/2003 | Chen et al. ................. | 438/614 |
| 2002/0109228 A1 | * | 8/2002 | Buchwalter et al. ........ | 257/738 |
| 2002/0168466 A1 | * | 11/2002 | Tapphorn et al. ........... | 427/180 |

* cited by examiner

*Primary Examiner*—Michael Trinh
(74) *Attorney, Agent, or Firm*—J.C. Patents

(57) ABSTRACT

A bonding column fabrication process for forming boding columns over a wafer. First, a mask layer is formed over the active surface of a wafer. The mask has a plurality of openings that exposes chip pads (or electrode pads) on the active surface of the wafer. A high-velocity physical metal deposition process is conducted to form at least one metallic material layer over the die pads (or electrode pads) inside the interior sidewalls of the openings. The metallic material layer inside the openings constitutes the bonding columns. Finally, the mask layer is removed and a surface layer is optionally formed over the exposed surface of the bonding columns.

11 Claims, 9 Drawing Sheets

PROCESS OF FORMING BONDING COLUMNS

CROSS-REFERENCE TO RELATED APPLICATION

This application is a continuation of a prior application Ser. No. 10/389,217, filed on Mar. 14, 2003, now U.S. Pat. No. 6,849,534 which claims the priority benefit of Taiwan application serial no. 91125108, filed on Oct. 25, 2002.

BACKGROUND OF THE INVENTION

1. Field of Invention

The present invention relates to a process of forming bonding columns. More particularly, the present invention relates to a process of forming bonding columns serving as bumps on a wafer using a high-velocity physical metal deposition technique.

2. Description of Related Art

Flip chip bonding technology is one of the principle techniques for forming a chip package. To form a flip chip package, bumps are formed on die pads arranged as an array on the active surface of a chip. Next, the chip is flipped over so that the bumps are electrically and physically connected to corresponding bonding pads on a carrier (for example, a substrate or a printed circuit board (PCB). Note that flip chip technique is able to produce a package having a higher pin count and occupying a smaller area. Moreover, average length of signal transmission paths is reduced considerably.

Before joining up a flip chip with a carrier such as a substrate or a PCB, bumps are first formed over the die pads on the active surface of the chip. A conventional process of attaching bumps to the die pads includes forming a stencil or a photo-film having a plurality of openings over the active surface of the chip (or wafer) to serve as a mask. The openings expose various die pads. Thereafter, a plating or printing step is carried out to fill the space bounded by the sidewalls of the openings and the active surface of the chip with solder material. Hence, a solder layer is formed over each die pad. The stencil or the photo-film is next removed to expose the solder layers over the die pads. Finally, a reflow process is conducted to form a bump having a spherical profile over each die pad.

FIGS. 1A to 1F are schematic cross-sectional views showing the progression of steps for producing a conventional bump over a wafer. First, as shown in FIG. 1A, a wafer 100 having an active surface 102, a plurality of die pads 104 and a passivation layer 106 thereon is provided. The die pads 104 are formed on the active surface 102 of the wafer 100. The passivation layer 106 covers the active surface 102 of the wafer 100 but exposes the die pads 104. The wafer 100 further includes an under-bump-metallurgy (UBM) layer 108 over the die pads 104. The under-bump-metallurgy layer 108 mainly serves as an interfacial layer that increases the bonding strength between subsequently formed bumps 116a (as shown in FIG. 1F) and the die pads 104. In addition, the wafer 100 may include a stress buffer layer 110 over the passivation layer 106. The stress buffer layer 110 indirectly exposes the die pads 104 through the under-ball-metallurgy layers 108. The layer 110 mainly serves as buffer when the bumps 116a are subjected to thermal stress.

As shown in FIG. 1B, a photo-film 112 is formed over the active surface 102 of the wafer 100. The photo-film 112 is photo-exposed and then chemically developed to form a photo-film 112 with a plurality of openings 114 as shown in FIG. 1C. Here, a stencil (not shown) with openings thereon may be used instead of the photo-film 112. As shown in FIG. 1D, solder material is deposited into the space bounded by the sidewalls of the openings 114 and the active surface 102 of the wafer 100 to form solder layers 116 over various die pads 104 (or under-bump-metallurgy layers 108) in an electroplating or a printing process. As shown in FIG. 1E, the photo-film 112 (or the stencil) is removed to expose the solder layers 116 over various die pads 104. Finally, as shown in FIG. 1F, a reflow process is conducted to form spherical bumps 116a over the die pads 104 (or the under-ball-metallurgy layers 108).

However, the aforementioned steps of fabricating bumps over the die pads at least includes the following setbacks:

1. Because the bump is made from a solder material (such as a lead solder or lead-free solder), an under-ball-metallurgy layer is often formed over the die pads in order to increase the bonding strength between the bump and the die pads. Hence, this extends not only the processing cycle extended, but also increases overall production cost.

2. Due to the formation of the under-ball-metallurgy layer over the die pads, inter-metallic compound (IMC) is often formed at the interface between the die pads and the bumps leading to a lowering of the bonding strength of the bumps to the die pads.

3. If a stencil is used to provide openings over the die pads and a printing step is used to place solder material over the die pads, accuracy of positioning is usually low due to the density of openings in the stencil. Hence, stencil-printing method is unsuitable for forming fine-pitch bumps over a chip (or a wafer).

4. If a photo-film combined with an electroplating (or printing) process is used to fabricate bumps over die pads, only bumps greater than 100 μm in diameter and an array of bumps having a bump pitch greater than 250 μm can be produced. This results from an intrinsic resolution of the openings and minimum separation between neighboring openings in all photo-processing operations.

5. When a printing process is used to deposit solder material over the die pads, voids are often created in the solder layer close to the surface of the die pads. Thus, reliability of the joint between the bump and the die pad after a reflow process will be compromised. Sometimes, the bottom section of a bump may be out of contact with its corresponding die pad resulting in an open circuit condition.

SUMMARY OF THE INVENTION

Accordingly, one object of the present invention is to provide a bonding column fabrication process for forming bonding columns over a wafer that can be used to replace the conventional bump fabrication process. Aside from increasing the bonding strength between die pads and corresponding the bonding columns and easing the fabrication of fine-pitch bonding columns, reliability of the bonds between the bonding columns and the die pads of a carrier (such as a substrate or a printed circuit board) is also improved. Thus, cycle time and production cost for fabricating a flip chip package is reduced.

To achieve these and other advantages and in accordance with the purpose of the invention, as embodied and broadly described herein, the invention provides a bonding column fabrication process suitable for fabricating bonding columns over the active surface of a wafer. First, a mask layer is formed over the active surface of a wafer. The mask has a plurality of openings that exposes die pads (or electrode pads) on the active surface of the wafer. A high-velocity physical metal deposition process is conducted to form at least one metallic material layer over the die pads (or electrode pads) inside the interior sidewalls of the openings. The metallic material layers inside the respective openings constitute the bonding columns. Finally, the mask layer is removed and a surface layer is optionally formed over the exposed surface of the bonding columns.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
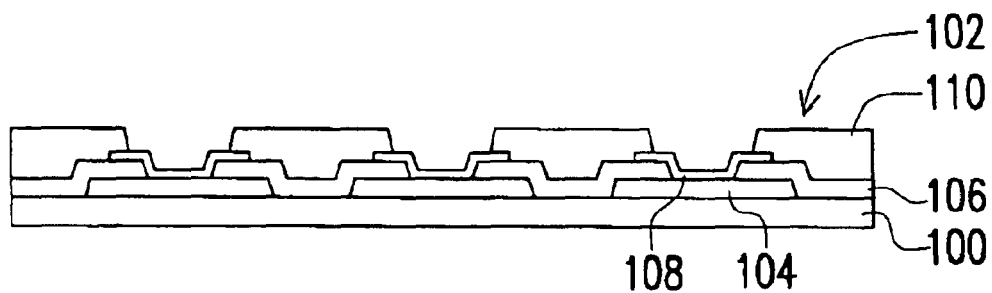
FIGS. 1A to 1F are schematic cross-sectional views showing the progression of steps for producing a conventional bump over a wafer.
Figure 1B:
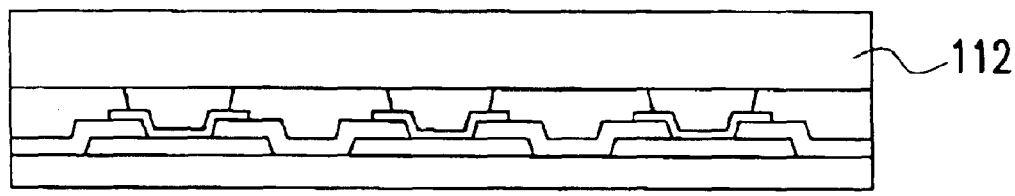
Figure 1C:
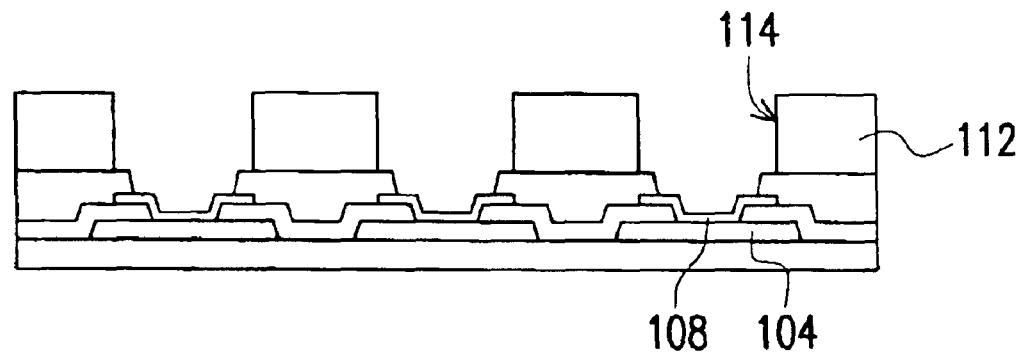
Figure 1D:
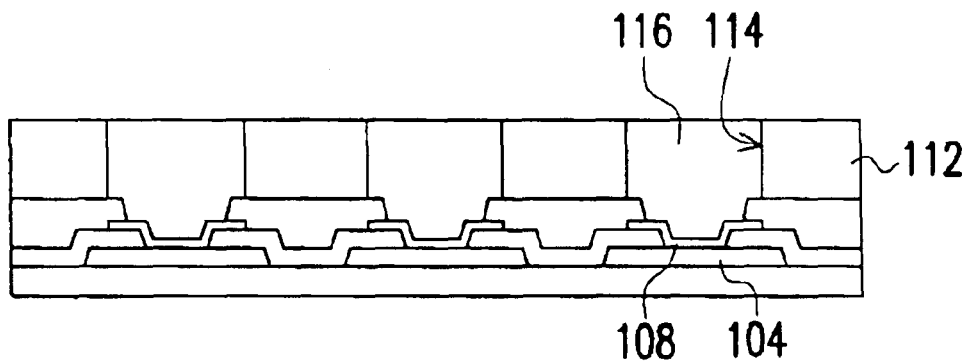
Figure 1E:
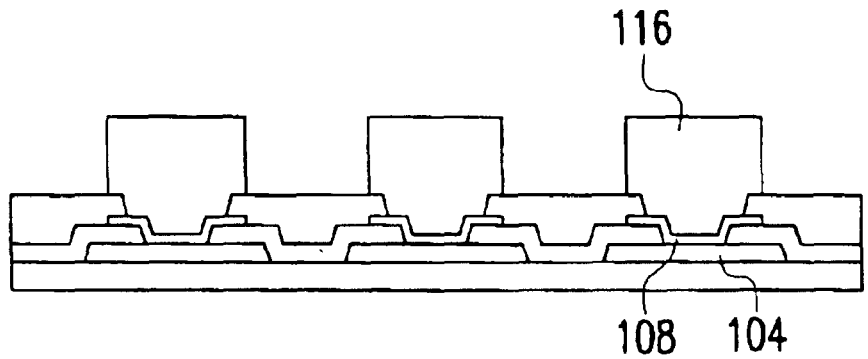
Figure 1F:
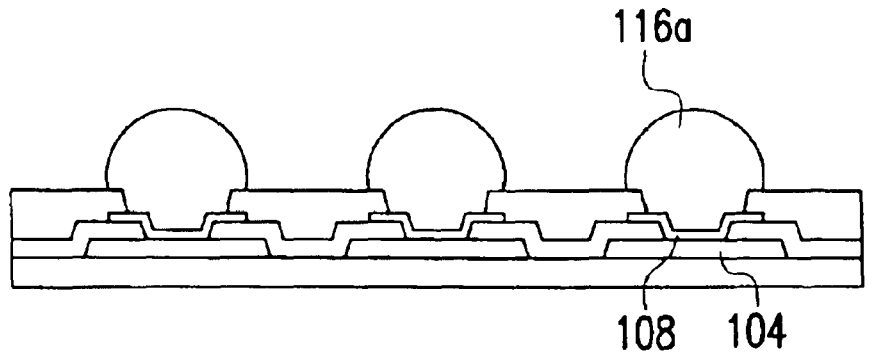

Reference will now be made in detail to the present preferred embodiments of the invention, examples of which are illustrated in the accompanying drawings. Wherever possible, the same reference numbers are used in the drawings and the description to refer to the same or like parts.

Figure 2A:
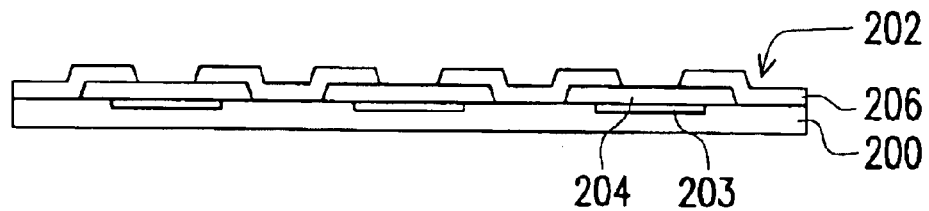
FIGS. 2A to 2F are schematic cross-sectional views showing the progression of steps for producing bonding columns over a wafer according to one preferred embodiment of this invention.

FIGS. 2A to 2F are schematic cross-sectional views showing the progression of steps for producing bonding columns over a wafer according to one preferred embodiment of this invention. First, as shown in FIG. 2A, a wafer 200 having an active surface 202, a plurality of die pads 204 and a passivation layer 206 thereon is provided. The die pads 204 are formed on the active surface 202 of the wafer 200. The passivation layer 206 covers the active surface 202 of the wafer 200 but exposes the die pads 204. Note that the wafer 200 may further include a stress buffer layer over the active surface 202 of the wafer 200. Since structural detail has already been shown in FIG. 1A, refer to the stress buffer layer 110 in FIG. 1A. To simplify the figure, no stress buffer layer is shown in FIGS. 2A to 2F.

Figure 2B:
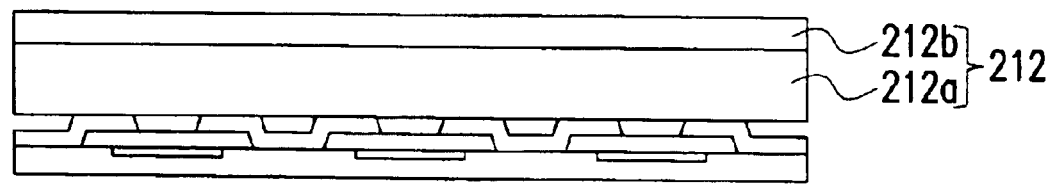

As shown in FIG. 2B, a first thin film 212a and a second thin film 212b are sequentially formed over the active surface 202 of the wafer 200. The second thin film 212b and the first thin film 212a together form a mask layer 212. The first thin film 212a and the second thin film 212b may be fabricated using an organic material including, for example, epoxy, polyimide and acrylic. The first thin film 212a and the second thin film 212b is formed, for example by attaching a first thin film and a then a second thin film over the active surface 202 of the wafer 200. Alternatively, a first thin film material and then a second thin film material are spin-coated over the active surface 202 of the wafer 200. To shorten cycle time, the mask layer 212 is preferably formed by attaching a composite film comprising a first thin film 212a and a second thin film layer 212b directly onto the active surface 202 of the wafer 200.

Figure 2C:
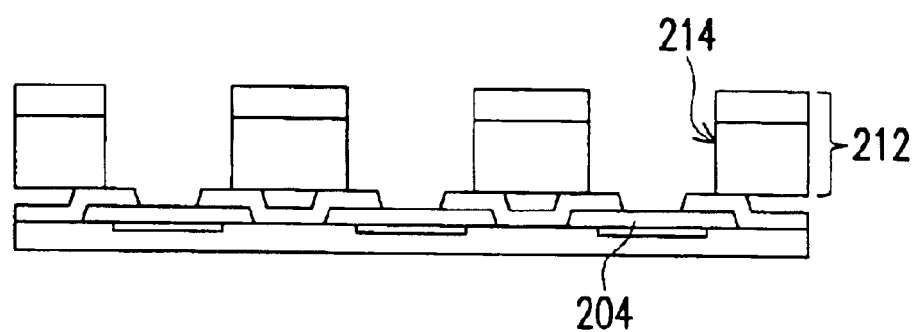

As shown in FIG. 2C, a plurality of openings 214 is formed in the mask layer 212. The openings 214 expose the respective die pads 204 on the wafer 200. The methods of forming the openings 214 in the mask layer 212 include photo-via, laser ablation and plasma etching. Similarly, to reduce cycle time, laser ablation or plasma etching method is preferred. Furthermore, instead of forming the openings 214 after the mask layer 212, a stencil or a film with openings thereon may also be used. If the stencil or film with opening is used, the step shown in FIG. 2B can be skipped but an accurate positioning technique must be used to align the openings 214 over the die pads 204 and a few more processing steps must be undertaken.

Figure 2D:
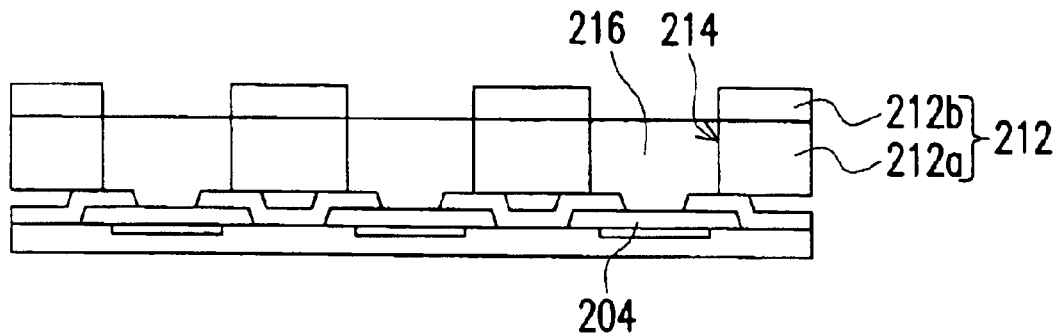

As shown in FIG. 2D, at least one metallic material layer is formed by deposition into the space bounded by the interior sidewalls of the openings 214 and the die pads 204 so that a plurality of bonding columns 216 are formed. A high-velocity physical metal deposition such as a metal spraying process or a high-speed particle consolidation process is carried out to form the metallic material layer. The metal spraying process includes arc spraying, plasma spraying, flame spraying, cathode arc ion plating or hollow cathode discharge. Note that the same type of metallic material as the die pads 204 such as aluminum, copper or an alloy of the two may be used to form the metallic material layers (the bonding columns 216). Aside from a single metallic material layer, the bonding column 216 may include a plurality of sequentially formed metallic material layers. In other words, each bonding column 216 may consist of a stack of metallic material layers.

Since the size of particles formed by a high-velocity physical metal deposition process has a diameter ranging between a few micrometers to a few tens of micrometers, depositing rate of metallic material is considerably higher than the depositing rate of solder material using a conventional electroplating method. Hence, production cycle is effectively reduced. Furthermore, high-velocity physical metal deposition rarely produces voids at the interface between the bottom of the bonding column and the die pad

204. Thus, open circuit condition is very much less than a solder bump formed by a conventional printing and reflow operation.

Figure 2E:
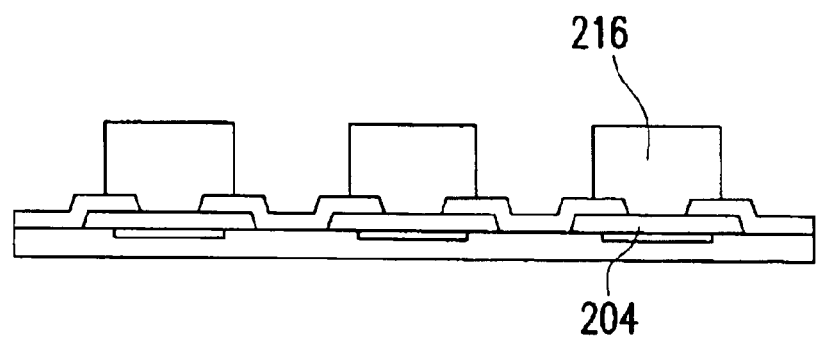

As shown in FIG. 2E, the mask layer 212, that is, both the second thin film 212b and the first thin film 212a are removed to expose the bonding columns 216. If thickness of the second thin film 212b is too thin to be removed, a polishing operation may be conducted to planarize the mask layer 212 globally so that the second thin film 212b, a portion of the metallic particles in bonding columns are removed. In the high-velocity physical metal deposition, some of the metallic particles are deposited on the mask layer 212 (the surface of second thin film 212b). The second thin film 212b functions as a barrier preventing the penetration of metallic particles into the first thin film 212a. The unwanted metallic particles remaining on top of the second thin film 212b will be completely removed together with the removal of second thin film 212b or the planarization of the mask layer 212.

Figure 2F:
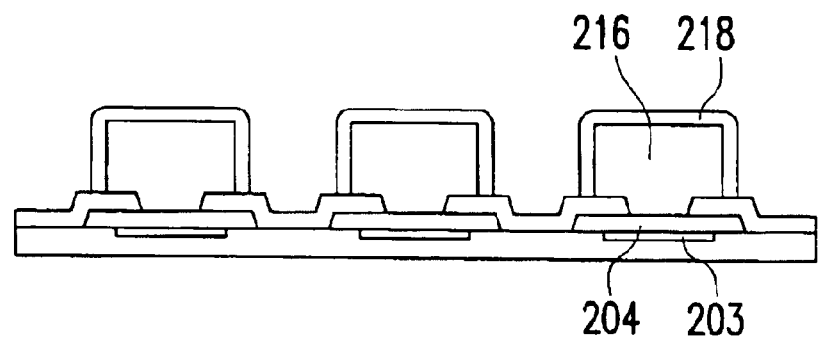

As shown in FIG. 2F, a surface layer 218 is optionally formed on the exposed surface of the bonding columns 216. The surface layer 218 can be a single metallic layer such as a solder layer or a lead-free solder layer or a composite metallic layer such as a nickel/gold composite layer or an organic surface preservation. The surface layer 218 is formed, for example, by electroplating or performing a dipping process. Note that copper is easily oxidized. Hence, if the bonding columns 216 are fabricated using copper material, the surface layer 218 is able to enclose and prevent the bonding columns 216 from oxidation. Furthermore, the surface layer 218 also increases the bonding strength of the bonding columns 216 with corresponding bonding pads (not shown) on the surface of a carrier (such as a substrate or a printed circuit board) when the wafer 200 and the carrier are electrically connected.

Figure 3:
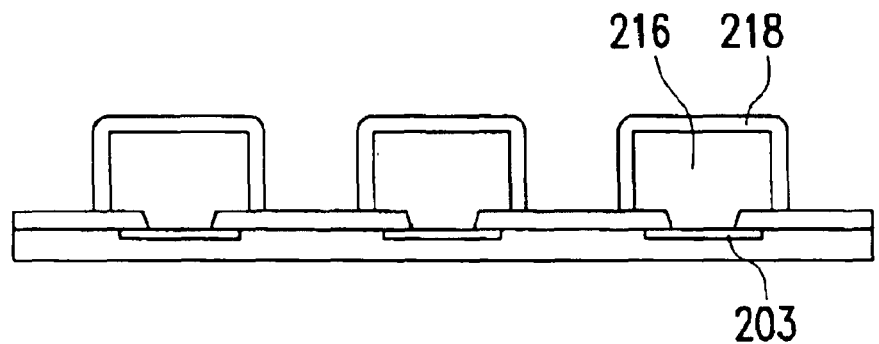
FIG. 3 is a cross-sectional view showing bonding columns in FIG. 2F over electrode pads on a wafer.

In general, electrode pads 203 as shown in FIG. 2A with connection to circuits (not shown) inside the wafer 200 will be exposed on the active surface 202 of the wafer 200 after devices and circuits are formed over the wafer 200. Thereafter, die pads 204 are formed over the respective electrode pads 203 so that height level and extent of the electrode pads 203 are increased. Finally, the passivation layer 206 is formed on the active surface 202 of the wafer 200. However, the positions of these electrode pads 203 may be redistributed through a patterned circuit layer (not shown). Ultimately, these electrode pads 203 is able to redistribute over the active surface 202 of the wafer 200 indirectly through the die pads 204 and the patterned circuit layer. In some cases, the redistribution of the electrode pads 203 on the wafer 200 through the patterned circuit layer is unnecessary. When this is the case, the process of fabricating bonding columns according to this invention (as shown in FIG. 2E or 2F) may be applied to fabricate bonding columns 216 directly over the electrode pads 203 on the wafer 200. In other words, the process for fabricating the die pads 204 can be eliminated and the bottom section of the bonding columns 216 instead of the die pads 204 can be used to increase the height level and extent of the electrode pads 203. FIG. 3 is a cross-sectional view showing bonding columns in FIG. 2F over electrode pads on a wafer.

Figure 4A:
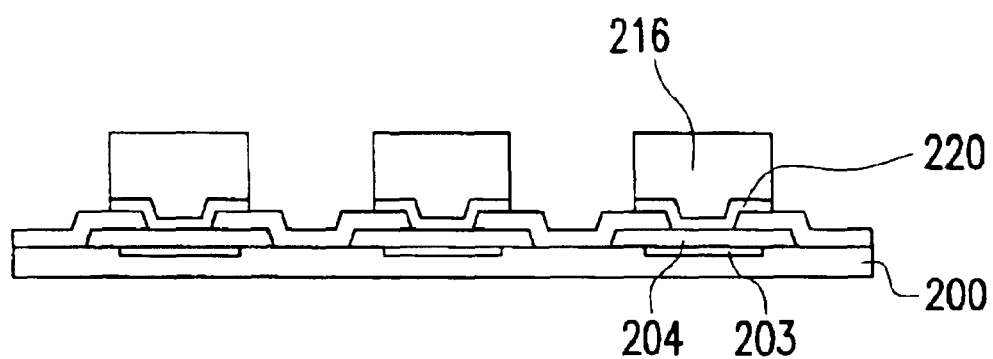
FIG. 4A is a cross-sectional view showing bonding columns having a buffer layer over die pads on a wafer.
Figure 4B:
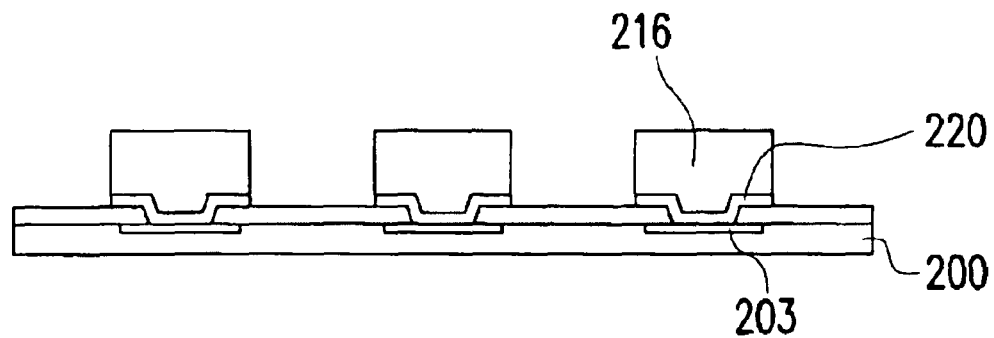
FIG. 4B is a cross-section view showing the bonding columns in FIG. 4A over electrode pads on a wafer.
Figure 5A:
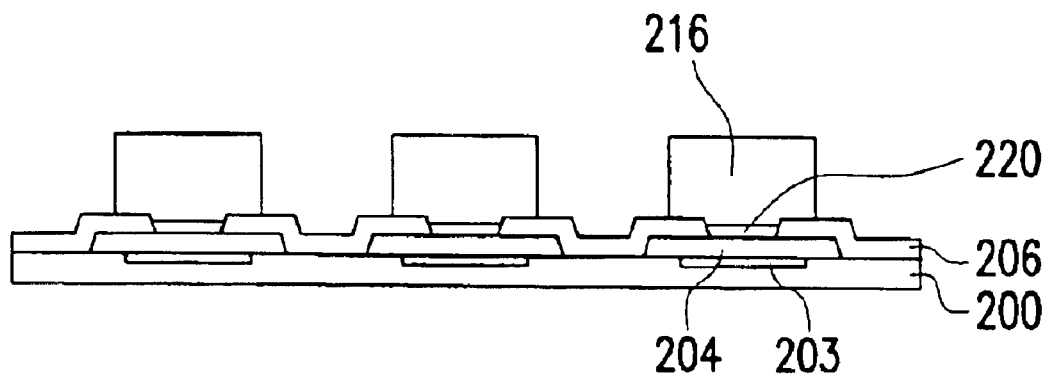
FIG. 5A is a cross-sectional view showing alternative type of bonding columns having a buffer layer over die pads on a wafer.
Figure 5B:
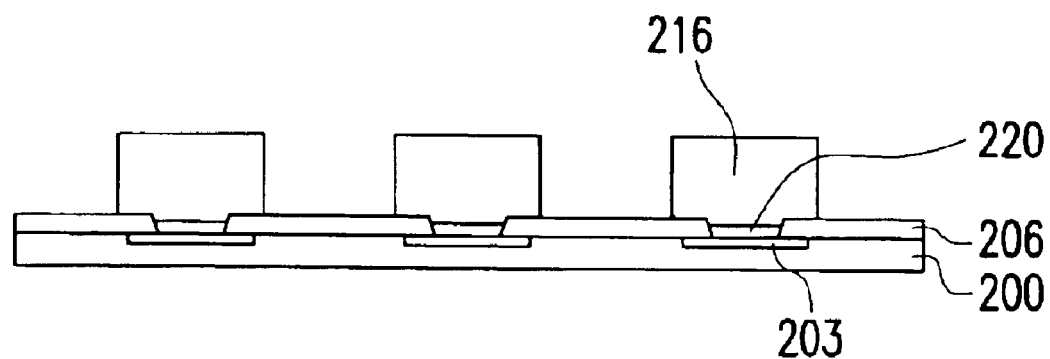
FIG. 5B is a cross-section view showing the bonding columns in FIG. 5A over electrode pads on a wafer.

FIG. 4A is a cross-sectional view showing bonding columns having a buffer layer over die pads on a wafer. As shown in FIG. 4A, a buffer layer 220 is formed between the bonding column 216 and the die pad 204 when the bonding column 216 and the die pad 204 are made from different materials. To form the buffer layer 220, some fabrication steps for forming the bonding column is changed starting from FIG. 2D. Metallic material is deposited into the openings 214 layer to form the buffer layer 220 as shown in FIG. 4A. Thereafter, at least one metallic material layer is formed over the buffer layer 220 to form the bonding column 216. If the bonding column 216 comprises of a stack of metallic layers, the buffer layer 220 is the bottom-most layer of the bonding column 216. Note that these steps may also be used to form a bonding column 216 over the electrode pad 203 of a wafer 200. FIG. 4B is a cross-section view showing the bonding columns in FIG. 4A over electrode pads on a wafer. In addition, the buffer layer 220 may form over the die pad 204 without covering the passivation layer 206 as shown in FIG. 5A. Similarly, the same steps may be used to form a bonding column 216 over the electrode pad 203 of a wafer 200 as shown in FIG. 5B. Furthermore, a surface layer may also be formed over the exposed surface of all the bonding columns 216 shown in FIGS. 4A, 4B, 5A and 5B like the surface layer 218 in FIG. 3.

Figure 6A:
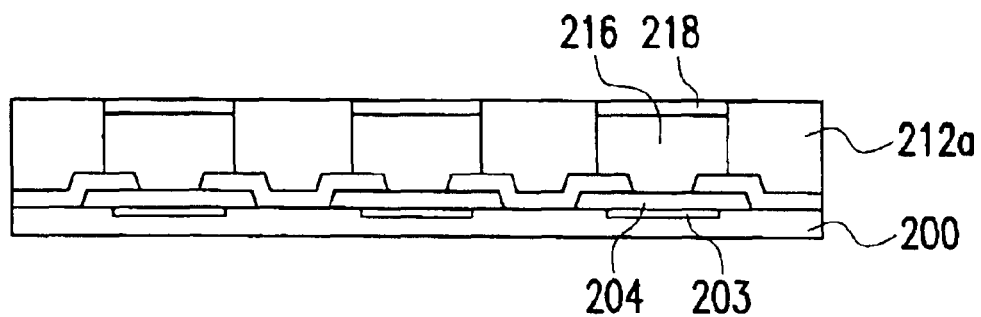
FIG. 6A is a cross-sectional view showing a portion of the mask layer retained on the wafer in a process for fabricating bonding columns according to one preferred embodiment of this invention.
Figure 6B:
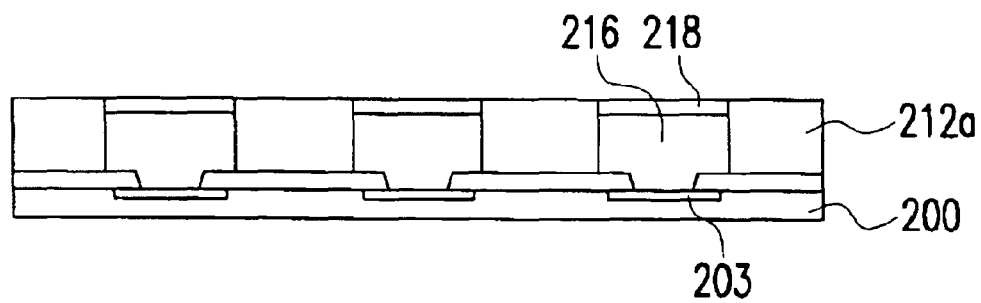
FIG. 6B is a cross-sectional view showing the bonding columns as shown in FIG. 6A over electrode pads on a wafer.

FIG. 6A is a cross-sectional view showing a portion of the mask layer retained on the wafer in a process for fabricating bonding columns according to one preferred embodiment of this invention. To eliminate the need for an underfill dispense process when a cut out chip from a wafer is flipped over and bonded with a carrier (such as a substrate or a printed circuit board), the bonding column fabrication process according to this invention is slightly modified starting in FIG. 2D. As shown in FIG. 2D, an underfill material is used to form the first thin film 212a. Thereafter, the second thin film 212b is removed while the first thin film 212a is retained to serve as an underfill layer. When the chip is connected to a carrier (such as a substrate or a printed circuit board) in a flip chip process, the first thin film 212a (or the underfill layer) functions as a filler material filling up the space between the chip and the carrier. Note that the same series of steps may be applied to form a bonding column over the electrode pad 203 of a wafer 200 as shown in FIG. 6B.

Furthermore, to increase the bonding strength between the bonding columns 216 and the carrier (a substrate or a printed circuit board), a surface layer 218 is formed over the exposed surface (the upper surface) of the bonding columns 216. Relative positions of the surface layers 218 after removing the second thin film 212b is shown in FIG. 6A. Note that the same series of steps may be applied to form a bonding column over the electrode pad 203 of a wafer 200 as shown in FIG. 6B. Moreover, the layers 218 in FIGS. 6A and 6B serve the same purpose as the surface layer 218 in FIGS. 2F and 3.

Figure 7A:
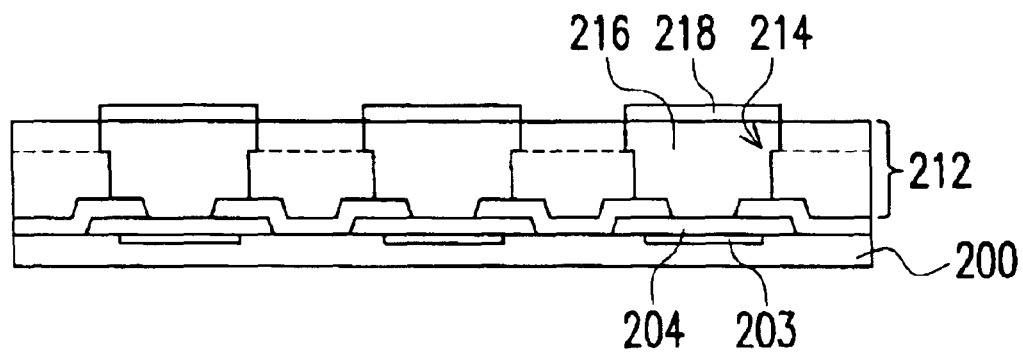
FIG. 7A a cross-sectional view showing the bonding columns having a step profile with a portion of the mask layer retained on a wafer according to one preferred embodiment of this invention.
Figure 7B:
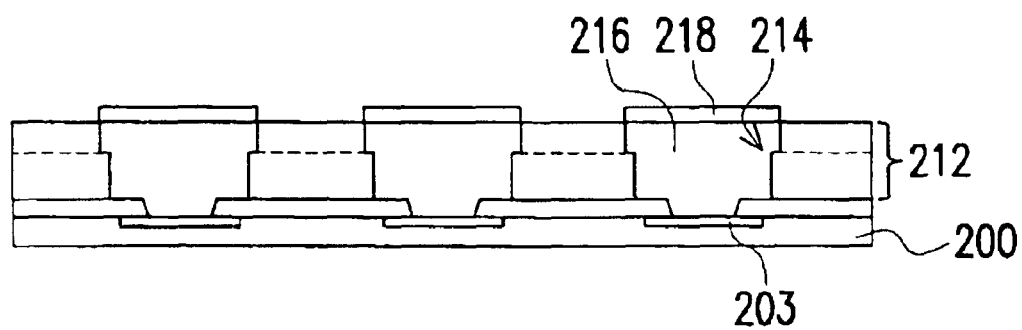
FIG. 7B is a cross-sectional view showing the bonding columns as shown in FIG. 7A over electrode pads on a wafer.

FIG. 7A is a cross-sectional view showing bonding columns having a step profile with a portion of the mask layer retained on a wafer according to one preferred embodiment of this invention. To form a bonding column 216 with a step configuration (or mushroom profile), steps for fabricating the bonding column 216 can be modified starting from FIG. 2D. The mask layer 212 may include not just the first thin film 212a and the second thin film 212b but a composite structure with a plurality of layers. Furthermore, small openings and large openings are formed in sequence in the mask layer 212 so that a pair of small and large opening forms a step opening 214. Hence, a bonding column 216 with a step configuration (or mushroom profile) is formed after metallic material is deposited into the openings 214. With this arrangement, the upper surface of the bonding columns 216 and hence the contact area between the bonding columns 216 and the contacts on a carrier (such as a substrate or a printed circuit board) is increased. An additional surface layer 218 may also be coated over the upper surface of the bonding columns 216 in a dipping process so that the bonding strength between the bonding columns 216 and the carrier is increased. Note that the aforementioned steps may be applied to fabricate bonding columns 216 over electrode pads 203 as shown in FIG. 7B.

Figure 8A:
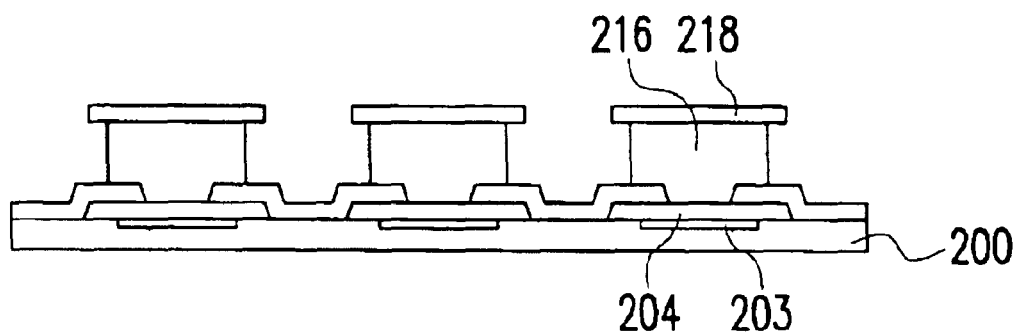
FIG. 8A is a cross-sectional view showing a surface layer on the top surface of each bonding column.
Figure 8B:
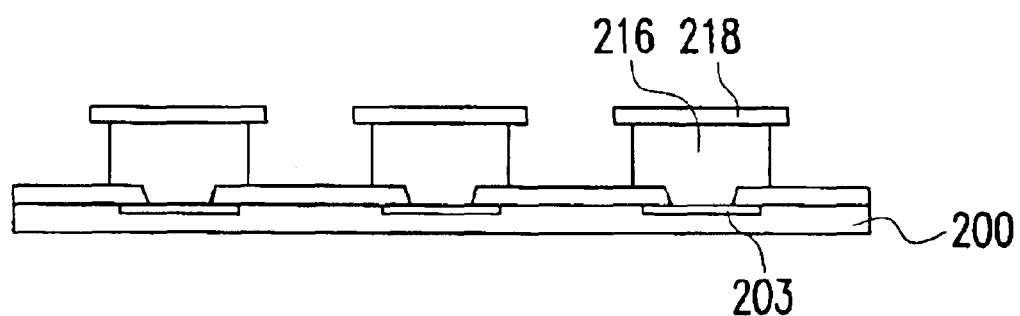
FIG. 8B is a cross-sectional view showing the bonding columns as shown in FIG. 8A over electrode pads on a wafer.

FIG. 8A is a cross-sectional view showing a surface layer on the top surface of each bonding column according to one preferred embodiment of this invention. At this case, the surface layer 218 is formed on the top surface of the bonding column 216 before removing the mask layer, wherein the surface layer 218 can be formed by printing, dipping, or plating process. Furthermore, the surface layer 218 has a larger surface area than that of the bonding column 216 and can be a single metallic layer such as a solder layer or a lead-free solder layer or a composite metallic layer such as a nickel/gold composite layer or an organic surface preservation or a conductive paste. Then, the mask layer is removed. Note that the aforementioned steps may be applied to fabricate bonding columns 216 over electrode pads 203 as shown in FIG. 8B.

This invention mainly provides a method of forming bonding columns over a wafer. First, a mask layer is formed over the active surface of a wafer. A plurality of openings is formed in the mask layer to expose various die pads (or electrode pads) on the active surface of the wafer. A high-velocity physical metal deposition process is carried out to form at least one metallic material layer over the die pads (or electrode pads) inside the openings. Thus, bonding columns are formed over each die pad (or electrode pad). Thereafter, a surface layer is formed over the exposed surface of the bonding columns optionally. Because the bonding columns are made using a material identical to the die pad, the bonding columns and the die pads has good bonding strength. Hence, there is no need to fabricate an under-ball-metallurgy layer between the bonding column and the die pad to strengthen the bond. In addition, the bonding columns can be directly fabricated over the electrode pads on the wafer without having to form die pads over the wafer. This arrangement eliminates a few processing steps and hence reduces the overall production cost.

In conclusion, the bonding column fabrication process according to this invention has at least the following advantages:

1. Material identical to the die pad may be selected to form the bonding columns so that each pair of bonding column and die pad is bonded together with a great strength. This eliminates the need to form an interfacial under-ball-metallurgy layer (performing processes such as sputtering or etching) and hence no more undesirable inter-metallic compounds are formed between the bonding column and the die pad.

2. On the other hand, if the bonding columns are fabricated using a material different from the die pad, a buffer layer serving as the bottom-most layer in the bonding column is formed over each die pads prior to forming the bonding columns. The buffer layer increases the bonding strength between the bonding columns and the die pads. The same series of steps may be applied to form bonding columns over the electrode pads on a wafer.

3. The bonding columns are formed in a high-velocity physical metal deposition process. The high-velocity physical metal deposition process is capable of depositing at least one metallic material layer over the die pads (or the electrode pads). Since diameter of the metallic particles produced by the process is relatively large, cycle time is shortened considerably. Moreover, the deposition process is able to prevent the formation of voids at the bottom section of the bonding columns.

4. Laser ablation or plasma etching process is used to form openings in the mask layer. Since both the laser ablation and plasma etching process is capable of producing opening with small diameter and fine pitch, this invention permits the formation of bonding columns on a wafer having small and fine-pitch die pads (or electrode pads).

5. Aside from forming bonding columns over the die pads (or electrode pads) of a wafer, an underfill layer may be directly formed over the active surface of the wafer. The underfill layer is able to fill up the space between the chip and a carrier (such as a substrate or a printed circuit board) when a cut out chip from the wafer is attached to the carrier and hence eliminates the need to perform an independent underfill dispense process.

6. This invention also provides a method of fabricating bonding columns with a step profile (or mushroom profile) so that the upper surface area of the bonding columns and hence contact area between the chip and the carrier is increased. Thus, electrical and mechanical connectivity between the chip and the carrier is strengthened.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents. invention cover modifications and variations of this invention provided they fall within the scope of the following claims and their equivalents.

What is claimed is:

1. A bond column fabrication process for forming at least one bonding column over a wafer, wherein the wafer has an active surface, a passivation layer and at least one metal pad, the passivation layer and the metal pad are on the active surface of the wafer with the passivation layer exposing the metal pad, the process at least comprising the steps of:

sequentially forming a first thin film and a second thin film over the active surface of the wafer, wherein the first thin film and the second thin film form a mask layer, and wherein the mask layer has at least one opening that exposes the metal pad;

forming at least one metallic material layer over the mask layer filling the opening in a high-velocity physical metal deposition process to serve as the bonding column, wherein the second film of the mask layer prevents penetration of metallic particles into the first thin film during the high-velocity physical metal deposition process; and performing a planarization process to remove the second thin film and retaining the first thin film to serve as an underfill layer.

2. The fabrication process of claim 1, wherein the process further includes a step of forming a surface layer over the exposed surface of the bonding columns.

3. The fabrication process of claim 2, wherein material constituting the surface layer is selected from a group consisting of nickel-gold alloy, leaded solder material, lead-free solder material and organic surface preservation.

4. The fabrication process of claim 1, wherein the metal pad is the die pad.

5. The fabrication process of claim 1, wherein the metal pad is the electrode pad.

6. The fabrication process of claim 1, wherein the step of forming a mask layer over the wafer includes the sub-steps of:

depositing material to form a mask layer over the active surface of the wafer; and forming openings in the mask layer.

7. The fabrication process of claim 6, wherein the step of forming openings in the mask layer includes a process selected from a group consisting of conducting a photo-via process, a laser ablation process and a plasma etching process.

8. The fabrication process of claim 1, wherein the step of removing the second thin film includes using a polishing method to remove the second thin film and a portion of the metallic material layer on the surface of the second thin film.

9. The fabrication process of claim 1, wherein the high-velocity physical metal deposition process for forming the bonding column is selected from a group consisting of high-speed particle consolidation process, metal spraying process, plasma spraying process, flame spraying process, high-speed oxygen fuel spraying process, cathode arc ion plating process and hollow cathode discharge process.

10. The fabrication process of claim 1, wherein the wafer may further include a stress buffer layer over the passivation layer such that the stress buffer layer also exposes the metal pad, and the step of forming the mask layer includes depositing mask material over the buffer stress layer.

11. A bond column fabrication process for forming at least one bonding column over a wafer, wherein the wafer has an active surface, a passivation layer and at least one metal pad, the passivation layer and the metal pad are on the active surface of the wafer with the passivation layer exposing the metal pad, the process at least comprising the steps of:

sequentially forming a first thin film and a second thin film over the active surface of the wafer, wherein the first thin film and the second thin film form a mask layer, and wherein the mask layer has at least one opening that exposes the metal pad;

forming at least one metallic material layer over the mask layer filling the opening in a high-velocity physical metal deposition process to serve as the bonding column, wherein the second film of the mask layer prevents penetration of metallic particles into the first thin film during the high-velocity physical metal deposition process; and performing a planarization process to sequentially remove the second thin film, and removing the first thin film, wherein removing the second thin film includes using a polishing method to remove the second thin film and a portion of the metallic material layer on the surface of the second thin film.

* * * * *